United States Patent
Matayabas, Jr. et al.

(10) Patent No.: US 7,141,454 B2
(45) Date of Patent: Nov. 28, 2006

(54) WIRE-BONDED PACKAGE WITH ELECTRICALLY INSULATING WIRE ENCAPSULANT AND THERMALLY CONDUCTIVE OVERMOLD

(75) Inventors: J. Christopher Matayabas, Jr., Chandler, AZ (US); Constance L. Gettinger, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 93 days.

(21) Appl. No.: 10/731,177

(22) Filed: Dec. 9, 2003

(65) Prior Publication Data

US 2004/0266068 A1    Dec. 30, 2004

Related U.S. Application Data

(62) Division of application No. 10/611,549, filed on Jun. 30, 2003.

(51) Int. Cl.
*H01L 21/48*    (2006.01)

(52) U.S. Cl. .................................... 438/127
(58) Field of Classification Search ............... 438/106, 438/112, 124, 126, 127
See application file for complete search history.

(56) References Cited

U.S. PATENT DOCUMENTS

| | | | |
|---|---|---|---|
| 4,768,081 A | 8/1988 | Moeller | |
| 4,843,036 A * | 6/1989 | Schmidt et al. | 438/64 |
| 5,087,961 A | 2/1992 | Long et al. | |
| 5,166,772 A | 11/1992 | Soldner et al. | |
| 5,258,650 A | 11/1993 | Polak et al. | |
| 5,436,203 A * | 7/1995 | Lin | 29/841 |
| 5,866,953 A | 2/1999 | Akram et al. | |
| 6,206,997 B1 | 3/2001 | Egitto et al. | |
| 6,252,308 B1 * | 6/2001 | Akram et al. | 257/787 |
| 6,309,915 B1 | 10/2001 | Distefano | |
| 6,340,846 B1 | 1/2002 | LoBianco et al. | |
| 6,368,899 B1 * | 4/2002 | Featherby et al. | 438/127 |
| 6,617,683 B1 * | 9/2003 | Lebonheur et al. | 257/707 |
| 6,849,932 B1 | 2/2005 | Tsai et al. | |
| 2002/0006718 A1 | 1/2002 | Distefano | |
| 2002/0167079 A1 | 11/2002 | Pu et al. | |
| 2003/0092205 A1 | 5/2003 | Wu et al. | |

* cited by examiner

*Primary Examiner*—Scott B. Geyer
(74) *Attorney, Agent, or Firm*—Blakely, Sokoloff, Taylor & Zafman LLP

(57) ABSTRACT

The specification discloses an apparatus comprising a die mounted on a substrate, the die being connected to the substrate by a plurality of wires, and a mold cap encapsulating the die and the plurality of wires, the mold cap comprising an electrically insulating portion encapsulating the wires and at least a portion of the die and a thermally conductive portion overmolded on the die and the electrically insulating portion. Also disclosed is a process comprising providing a die connected to a substrate by a plurality of wires, encapsulating the wires and at least a portion of the die in an electrically insulating material, and encapsulating the die, the wires and the electrically insulating material in a thermally conductive material. Other embodiments are disclosed and claimed.

16 Claims, 5 Drawing Sheets

WIRE-BONDED PACKAGE WITH ELECTRICALLY INSULATING WIRE ENCAPSULANT AND THERMALLY CONDUCTIVE OVERMOLD

CROSS-REFERENCE TO RELATED APPLICATIONS

This application is a divisional of U.S. patent application Ser. No. 10/611,549, filed on Jun. 30, 2003, and claims priority therefrom under 35 U.S.C. § 120. The priority application is currently pending.

TECHNICAL FIELD

The present invention relates generally to semiconductor die packaging and in particular, but not exclusively, to thermally dissipative packaging of wire-bonded semiconductor dies.

BACKGROUND

FIG. 1 illustrates, an encapsulated wire-bonded die 100. The die 104 is bonded to a substrate 102 by a layer of adhesive 106, and the die is connected to the substrate by a plurality of wires 108. The die 104 and the wires 108 are surrounded by a mold cap 110 that protects them from environmental contamination, mechanical forces, and other elements which could damage them. Because the mold cap 110 encapsulates and surrounds the wires 108, it cannot be electrically conductive; if it were, it would cause a short circuit between wires. Materials that are not electrically conductive are generally also not thermally conductive, meaning that although the mold cap 110 helps the wire-bonded assembly by protecting it from environmental conditions, it also hinders the wire-bonded die by preventing the escape of heat generated by the die. Where the amount of power consumed by the die is small, the mold cap 110 allows sufficient heat transfer that the temperature of the die does not increase enough to cause it any damage. As the amount of power consumed by the die—and, consequently, the amount of heat generated by the die—increases, the inability of the mold cap 110 to transfer significant amounts of heat away from the die leads to large increases in the operating temperature of the die. If the die temperature becomes too high, it could cause the die to malfunction or fail completely.

BRIEF DESCRIPTION OF THE DRAWINGS

Non-limiting and non-exhaustive embodiments of the present invention are described with reference to the figures, which are not to scale unless noted and wherein like reference numerals refer to like parts throughout the various views unless otherwise specified.

DETAILED DESCRIPTION OF THE ILLUSTRATED EMBODIMENTS

Embodiments of a system and method for thermally dissipative packaging of wire-bonded semiconductor dies are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
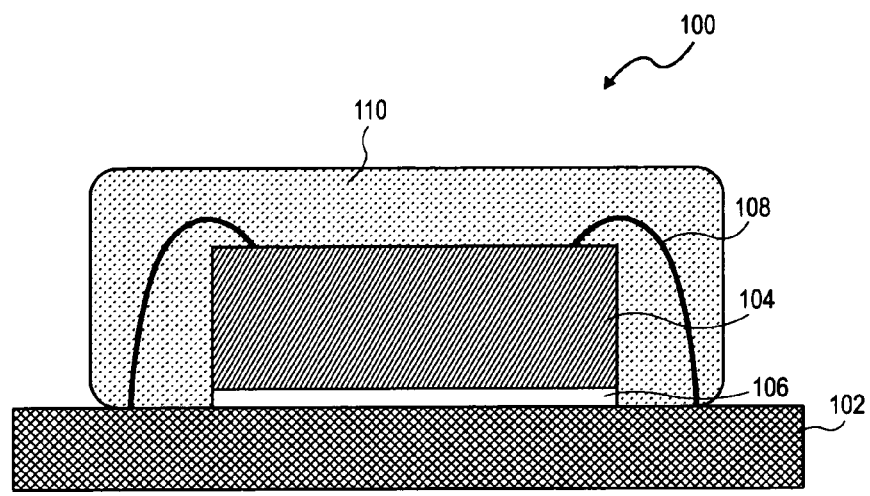
FIG. 1 is a side elevation of a prior art mold cap placed on a wire-bonded die.
Figure 2A:
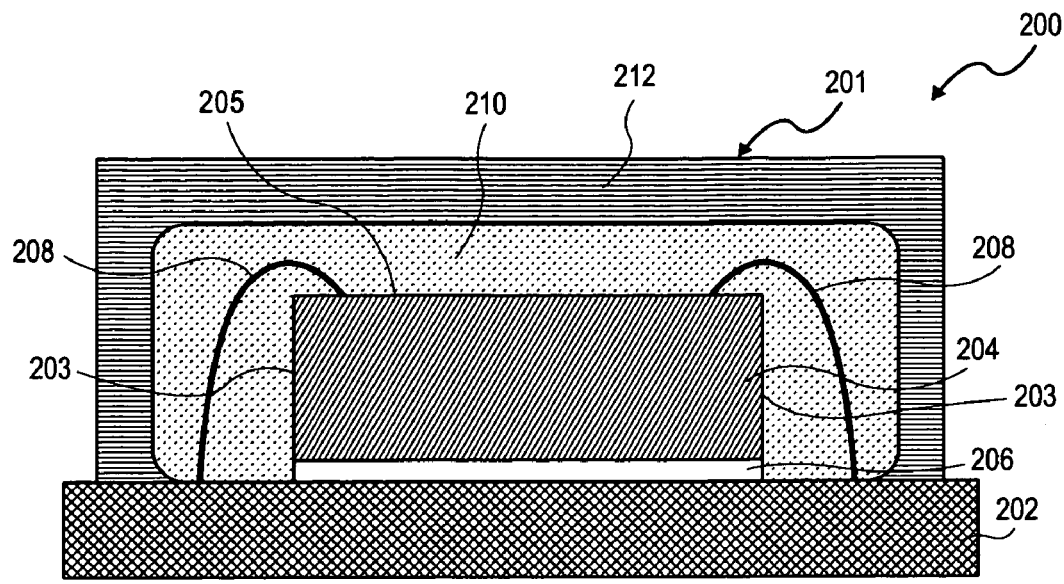
FIGS. 2A–2B are side elevations of embodiments of a mold cap placed on a single wire-bonded die.

FIG. 2A illustrates an embodiment of an encapsulated wire-bonded die 200. The wire-bonded die comprises a die 204 bonded to a substrate 202 using a layer of adhesive 206. In one embodiment, the die 204 comprises an integrated circuit, but in other embodiments it may be something different such as an optical die, microelectromechanical system (MEMS) die, etc. The die 204 is connected to the substrate by a plurality of wires 208. After the die 204 is attached to the substrate 202 and the wires 208 have been connected, a mold cap 201 is placed over the die and wires. The mold cap 201 includes an electrically insulating portion 210 and a thermally conductive portion 212. The electrically insulating portion 210 is placed over the die 204 and the wires 108 to encapsulate the wires and protect them from environmental contamination, and to prevent the wires from moving and touching each other. The electrically insulating portion covers substantially the entire die 204, and is in contact with the lateral surfaces 203 and the top surface 205 of the die. After the electrically insulating portion 210 is in position, a thermally conductive portion 212 is overmolded on top of the electrically insulating portion 210.

In one embodiment, the electrically insulating portion comprises a curable resin, a crosslinker, a catalyst, and a reinforcing filler. A variety of polymeric resins can be used, including epoxy, acrylate, bismaleimide, polyester, polyamide, olefin, and their combinations. Typically, the resin includes ceramic fillers for the purpose of increasing modulus, lowering coefficient of thermal expansion (CTE) and improving mechanical properties. Examples of suitable fillers include silica, alumina, zinc oxide, talc, and the like or their combinations. In various embodiments, the resin has melting point less than about 160° C., typically between about 40 and 120° C. Optionally, other additives known in the art can be used, such as demolding agents, adhesive modifiers, flow aids, colorants, stabilizers, plasticizers, impact modifiers, flame retardants, and other similar additives or combinations thereof.

In one embodiment where the electrically insulating portion 210 is made using a resin, it can be applied by processes known in the art, such as dispensing (e.g., dam-and-fill), spraying, screen printing, transfer molding, or injection molding. If desired, the electrically insulating portion 210 may be partially or completely cured prior to applying the thermally conductive portion 212. The resin may be cured by thermal, UV, laser, microwave, or other techniques known in the art, depending on the selection of catalyst, resin, and crosslinker. It is preferred that the electrically insulating portion be partially cured prior to applying the overmolded thermally conductive portion 212, to minimize its movement during overmolding yet provide good bonding to the thermally conductive portion. Typically, complete cure of the mold cap 201 is obtained by oven curing at elevated temperatures after overmolding.

The thermally conductive portion 212 can be made of any material that is readily moldable and has the appropriate thermal conductivity for the application in which it will be used. In one embodiment, the thermally conductive portion 212 comprises a curable resin, a crosslinker, a catalyst, and a metal filler. A wide variety of polymeric resins may be used including epoxy, acrylate, bismaleimide, polyester, polyamide, olefin, isocyanaurate, polyimide, and the like or combinations thereof. The metal filler should have a bulk thermal conductivity greater than about 100 W/m° K and melting point greater than about 200° C. Examples of suitable metal fillers include aluminum, silver, copper, gold, and the like metals or their combinations and alloys. The resin should have melting point less than about 160° C., typically between about 40 and 120° C. Optionally, other additives known in the art may be used, such as de-molding agents, adhesive modifiers, flow aids, colorants, stabilizers, plasticizers, impact modifiers, flame retardants, and the like additives or their combinations.

In one particular embodiment, the thermally conductive portion 212 is made of a material prepared by (1) dry blending in a blender with a grinding blade and cooling to maintain the temperature below 25° C. 13.5 g of epoxylated tetramethylbiphenol, 11.5 g of Bishenol F, 75 grams of silver powder, 0.3 g of carnauba wax, 0.2 g of 3,4-epoxypropyl trimethoxy silane, and 0.15 g of triphenyl phosphine; and (2) roll milling the mixture at 110° C. The resulting material is then ground and pressed into a pellet. The material is observed to have a bulk thermal conductivity of approximately 4.0 W/m° K. As with the electrically insulating portion 210, the thermally conductive portion 212 can be applied by processes known in the art, such as dispensing (e.g., dam-and-fill), screen printing, transfer molding, or injection molding. Similarly, the thermally conductive portion can be cured by thermal, UV, laser, microwave, or other techniques known in the art, depending on the selection of catalyst, resin, and crosslinker.

Figure 2B:
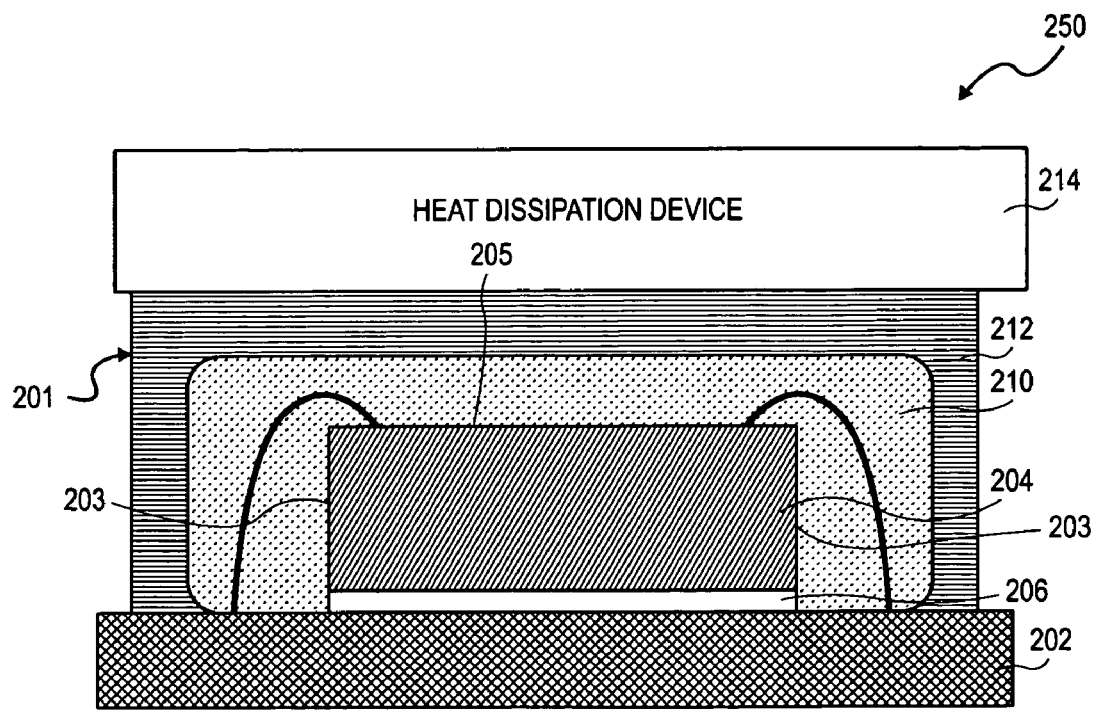

FIG. 2B illustrates an embodiment of an encapsulated wire-bonded die 250. The encapsulated wire-bonded die 250 is similar in construction to the encapsulated die 200. The primary difference is that the encapsulated die 250 includes a heat dissipation device 214 attached to, and in thermal contact with, the exterior of the thermally conductive portion 212 of the mold cap 201. With the addition of the heat dissipation device 214, the ability to remove heat generated in the die is further enhanced. In various embodiments the heat dissipation device 214 can comprise fins, a heat sink, a vapor chamber, a heat plate and the like.

Figure 3A:
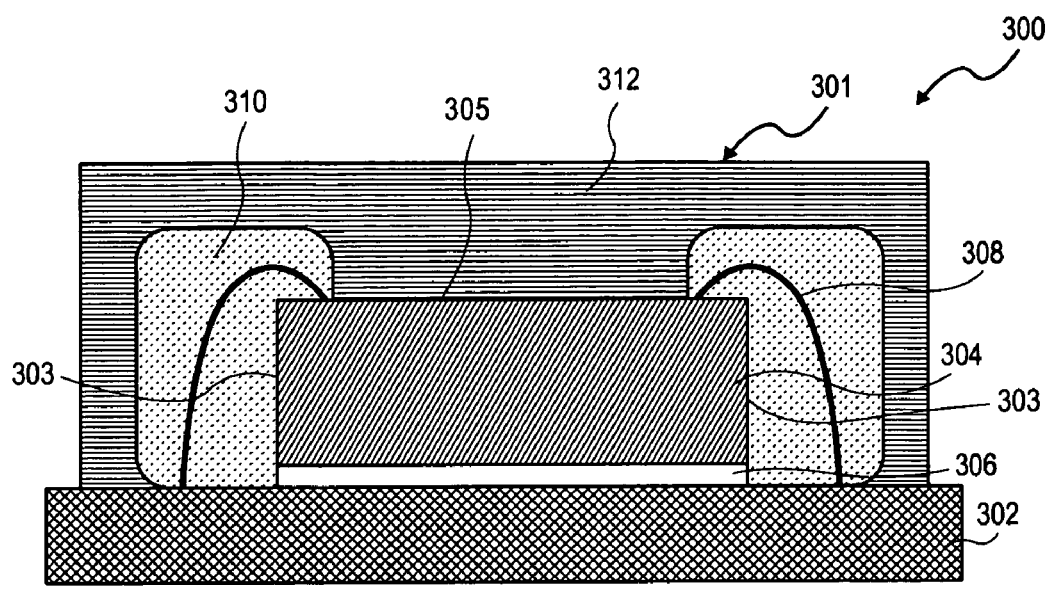
FIGS. 3A–3B are side elevation of alternative embodiments of a mold cap placed on a single wire-bonded die.

FIG. 3A illustrates an embodiment of an encapsulated wire-bonded die 300. As with the encapsulated dies 200 and 250, the encapsulated die 300 comprises a die 304 bonded to a substrate 302 using a layer of adhesive 306. In one embodiment the die 304 comprises an integrated circuit, but in other embodiments it may be something different such as an optical die, microelectromechanical system (MEMS) die, etc. The die is connected to the substrate by a plurality of wires 308, and a mold cap 301 is placed over the die and wires. Like the mold cap 201, the mold cap 301 includes an electrically insulating portion 310 and a thermally conductive portion 312. The mold cap 301, however, has a different construction than the mold cap 201. In the mold cap 301, the electrically insulating portion 310 is positioned only around the perimeter of the die 304, such that it still encapsulates the wires 308 but only partially encapsulates the die 304. In other words, the electrically insulating portion 310 covers the wires but is only in contact with the sides 303 and a small portion near the perimeter of the top 305 of the die. Once the electrically insulating portion 310 is in place, the thermally conductive portion 312 is overmolded on top of the die and the electrically insulating portion. Once in place, the thermally conductive portion is in direct contact with a large portion of the top surface 305 of the die. This direct contact between the thermally conductive portion and the die means that the mold cap 301 has greatly enhanced heat transfer compared tot he mold cap 201, since thermal energy from large portions of the die 314 is more quickly transferred through the mold cap because it no longer has to cross an electrically insulating (and therefore thermally insulating) portion.

The mold cap 301 can be made using the same electrically insulating and thermally conductive materials discussed above in connection with the mold cap 201. The techniques used to apply the electrically insulating portion 310 and the thermally conductive portion 312 are also as discussed above, except that in the application of the insulating portion 310 the techniques must be modified to allow the electrically insulating material to be placed only around the sides 303 of the die and on a small portion of the top 305, while still covering the wires 308.

Figure 3B:
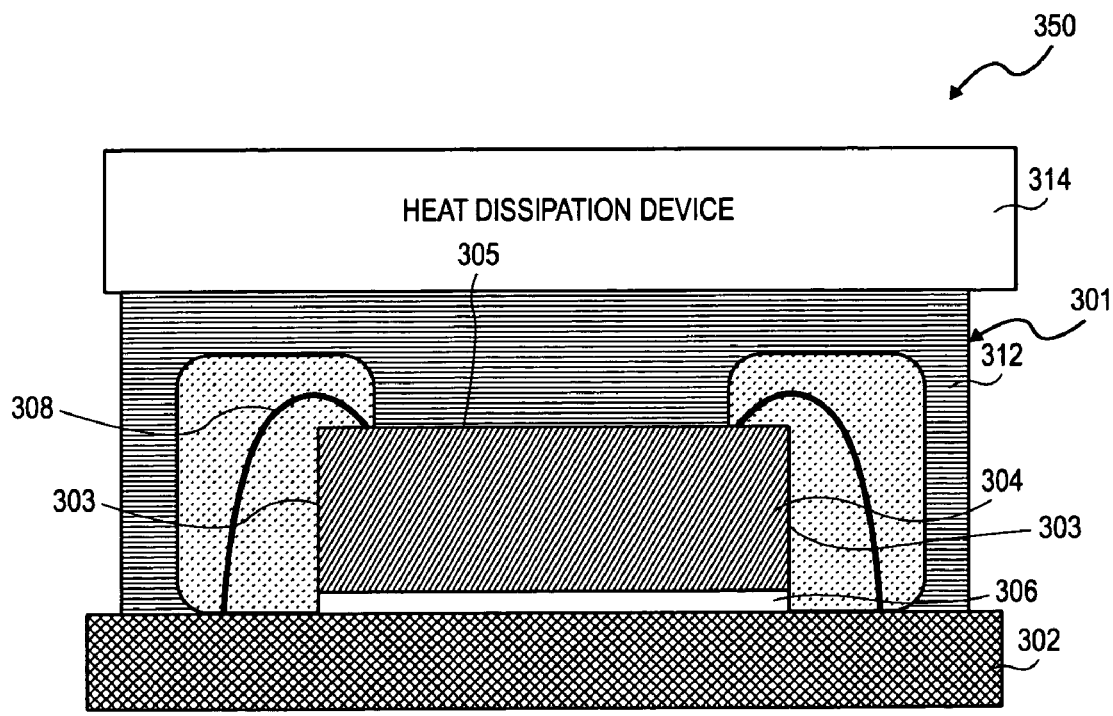

FIG. 3B illustrates an embodiment of an encapsulated wire-bonded die 350. The encapsulated wire-bonded die 350 is similar in construction to the encapsulated die 300. The primary difference is that the encapsulated die 350 includes a heat dissipation device 314 attached to, and in thermal contact with, the exterior of the thermally conductive portion 312. With the thermally conductive portion 312 in direct contact with the die and the addition of the heat dissipation device 314, the ability to remove heat generated by the die is further enhanced. In various embodiments the heat dissipation device 314 can comprise fins, a heat sink, a vapor chamber, a heat plate and the like.

Figure 4A:
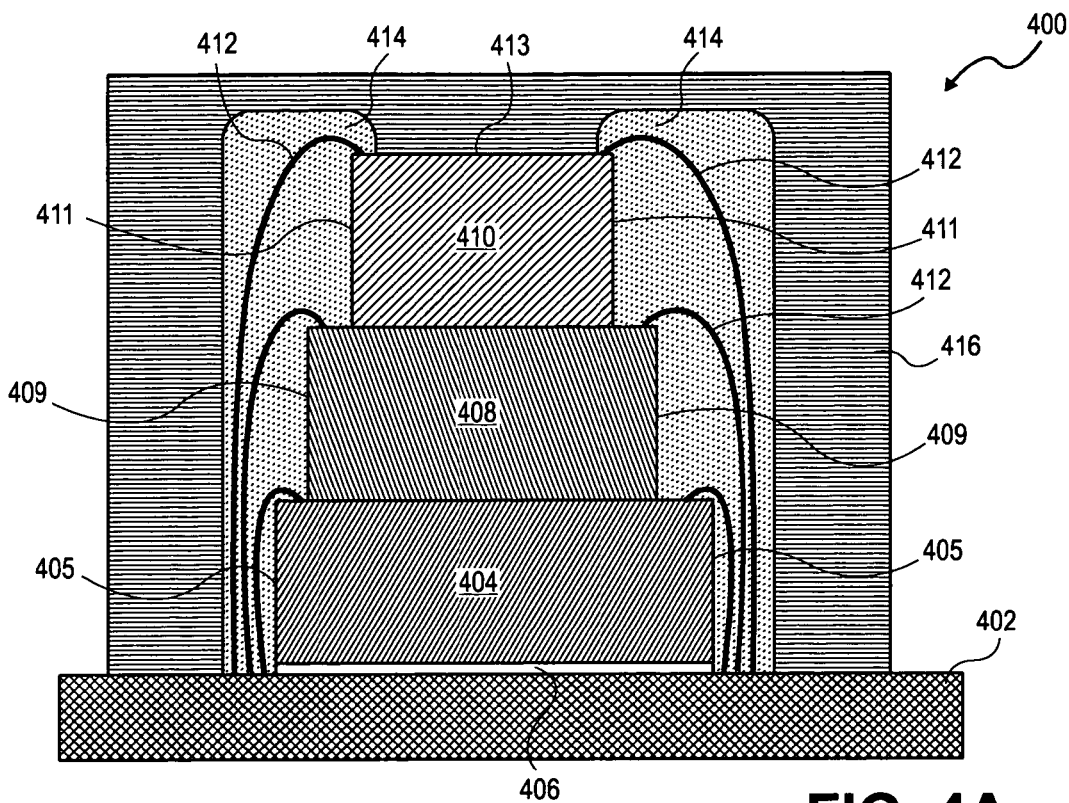
FIGS. 4A–4B are side elevations of alternative embodiments of a mold cap placed on stacked wire-bonded dies.

FIG. 4A illustrates an embodiment of an encapsulated wire-bonded die stack 400. The die stack comprises a first die 404 attached to a substrate 402 by a layer of adhesive 406. A second die 408 is stacked on the first die 404, and a third die 410 is stacked on the second die 408. In one embodiment the dies 402, 408 and 410 comprise integrated circuits, but in other embodiments they may be something different such as an optical dies, microelectromechanical system (MEMS) dies, etc, and they need not all be the same type of die. All three dies 404, 408 and 410 are connected to the substrate 402, or to one of the other dies in the stack, by wires 412. After the dies 404, 408 and 410 are attached to the substrate 402 and the wires 408 have been connected, a mold cap 401 is placed over the die and wires. Like the mold cap 301, the mold cap 401 includes an electrically insulating portion 410 and a thermally conductive portion 412, with the electrically insulating portion 410 is positioned only around the perimeter of the stacked dies 404, such that it completely encapsulates the wires 412 and covers the sides 405 of the die 404, the sides 409 of the die 408, and the sides 411 and a large part of the top 413 of the third die 410. The electrically insulating portion 410 is only in contact with the sides 403 and a small portion near the perimeter of the top 405 of the die. Once the electrically insulating portion 410 is in place, the thermally conductive portion 412 is overmolded on top of the die and the electrically insulating portion. Once in place, the thermally conductive portion is in direct contact with a large portion of the top surface 405 of the die.

Figure 4B:
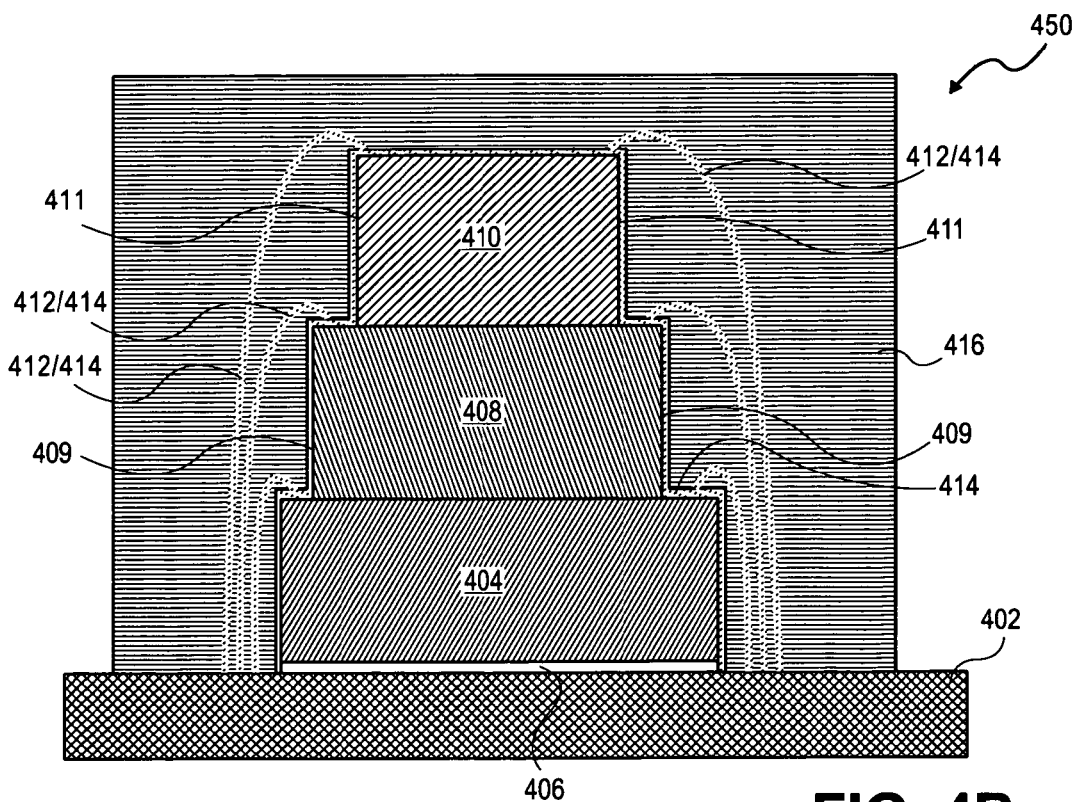

FIG. 4B illustrates an embodiment of an encapsulated wire-bonded die stack 450. The die stack is similar in construction to the die stack of the encapsulated die stack 400. The primary difference is in the positioning of the electrically insulating portion 414 and the thermally conducting portion 416. Heat transfer in stacked dies is more difficult than in single dies because in stacked dies most of the dies in the stack have a limited area through which heat can be transferred. For example, the second die 408 is sandwiched between the first die 404 and the third die 410, and cannot transfer much heat to those dies. The second die is left with only its sides 409 through which to transfer heat out of the die. Because the heat transfer area is limited, it is very desirable to have the thermally conductive portion 416 very close to, or in direct contact with, the exposed surfaces of the die. In the mold cap 451, the electrically insulating portion 414 is deposited (e.g., by spraying) directly on the wires 412 and only very thinly, if at all, around the dies. The thermally conducting portion 416 is then overmolded onto the dies, the wires, and the electrically insulating portion 414.

Figure 5:
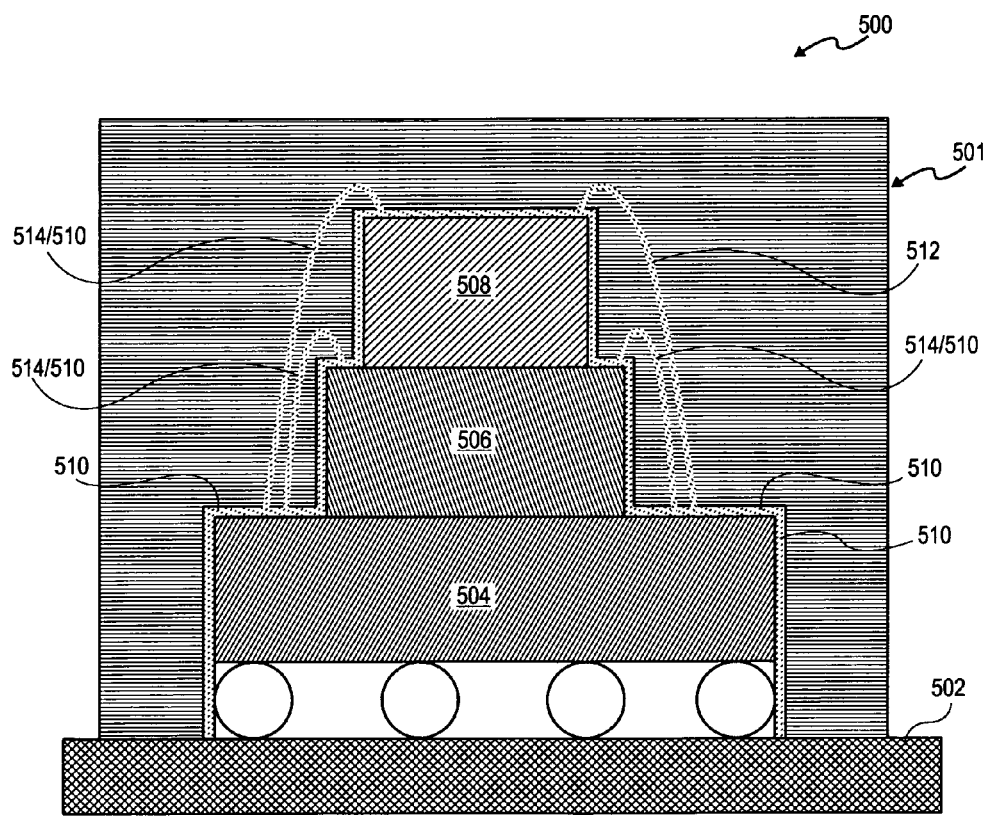
FIG. 5 is a side elevation of an embodiment of a mold cap placed on wire-bonded dies stacked on a flip-chip bonded die.

FIG. 5 illustrates an encapsulated mixed-bonding die stack 500. The die stack is a "mixed-bonding" stack because it comprises dies bonded in different ways. The die stack comprised a first die 504 that is flip-chip bonded to the substrate, and a second die 506 and third die 508 wire-bonded to the first die 504. In one embodiment the dies 504, 506 and 508 comprise integrated circuits, but in other embodiments they may comprise something different such as an optical dies, microelectromechanical system (MEMS) dies, etc, and they need not all be the same type of die. The mold cap 501 is configured with the electrically insulating portion 510 deposited on the wires 514 and thinly on the dies, while thermally conductive portion 512 is overmolded onto the dies, the wires, and the electrically insulating portions. A mold cap such as mold cap 501, or any of the other mold caps described herein can also be used with other types of die packaging, for example wire-bonded PBGA, multi-matrix array packaging (MMAP), and folded stack packaging.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A process comprising:
   providing a die connected to a substrate by a plurality of wires;
   encapsulating the wires and the entire die in an electrically insulating material; and
   entirely encapsulating the die, the wires and the electrically insulating material in a thermally conductive material, wherein the thermally conductive material is in contact with the entire part of the surface of the electrically insulating material that is not in contact with the substrate, the die or the wires, wherein the thermally conductive material comprises a curable resin, a crosslinker, a catalyst, and a metal filler comprising aluminum, silver, copper, gold, or combinations or alloys thereof.

2. The process of claim 1 wherein encapsulating the wires and at the entire die in an electrically insulating material comprises applying the electrically insulating material around a perimeter of the die by dispensing, spraying, screen printing, transfer molding, or injection molding.

3. The process of claim 2 wherein encapsulating the wires and at least a portion of the die in an electrically insulating material further comprises curing the electrically insulating material using thermal, UV, laser, or microwave curing.

4. The process of claim 1 wherein encapsulating the die, the wires and the electrically insulating material in a thermally conductive material comprises applying the thermally conductive material on the die, the wires and the electrically insulating material by dispensing, spraying, screen printing, transfer molding, or injection molding.

5. The process of claim 4 wherein encapsulating the die, the wires and the electrically insulating material in a thermally conductive material further comprises curing the electrically insulating material using thermal, UV, laser, or microwave curing.

6. The process of claim 1 wherein the die comprises an integrated circuit.

7. A process comprising:
   providing a stack of dies, the stack including a first die attached by one or more wires to a substrate and at least one additional die stacked thereon;
   encapsulating the one or more wires and at least a portion of the stack of dies in an electrically insulating material; and
   encapsulating the stack of dies, the one or more wires and the electrically insulating material in a thermally conductive material.

8. The process of claim 7 wherein encapsulating the wires end at least a portion of the stack of dies in an electrically insulating material comprises applying the electrically insulating material around a perimeter of the stack of dies by dispensing, spraying, screen printing, transfer molding, or injection molding.

9. The process of claim 8 wherein the electrically insulating material is thinly applied to the wires and the perimeter of the stack of dies.

10. The process of claim 8 wherein encapsulating the wires and at least a portion of the stack of dies in an electrically insulating material further comprises curing the electrically insulating material using thermal, UV, laser, or microwave curing.

11. The process of claim 7 wherein encapsulating the stack of dies, the wires and the electrically insulating material in a thermally conductive material comprises applying the thermally conductive material on the stack of dies, the wires and the electrically insulating material by dispensing, spraying, screen printing, transfer molding, or injection molding.

12. The process of claim 11 wherein encapsulating die stack of dies, the wires and the electrically insulating material in a thermally conductive material further comprises curing the electrically insulating material using thermal, UV, laser, or microwave curing.

13. The process of claim 7 wherein the thermally conductive material comprises a curable resin, a crosslinker, a catalyst, and a metal filler.

14. The process of claim 7 wherein the metal filler comprises aluminum, silver, copper, gold, or combinations or alloys thereof.

15. The process of claim 7 wherein the first die is flip-chip bonded to the substrate.

16. The process of claim 7 wherein at least one of the stacked dies comprises an integrated circuit.

* * * * *